United States Patent [19]
Kistner et al.

[11] Patent Number: 5,137,758
[45] Date of Patent: Aug. 11, 1992

[54] APPARATUS AND METHOD FOR COATING FLEXIBLE SHEETS WHILE INHIBITING CURL

[75] Inventors: John F. Kistner, Oakdale; Thomas M. Milbourn, Mahtomedi; Robert G. Pleban, Lake Elmo, all of Minn.

[73] Assignee: Minnesota Mining and Manufacturing Company, St. Paul, Minn.

[21] Appl. No.: 675,653

[22] Filed: Mar. 27, 1991

[51] Int. Cl.⁵ .............................................. B05D 3/12
[52] U.S. Cl. ................................. 427/350; 118/231; 118/500; 118/641; 118/668; 226/95; 427/45.1; 427/53.1; 427/54.1; 427/55
[58] Field of Search ................... 427/45.1, 53.1, 54.1, 427/55, 294, 296, 350, 385.5; 118/68, 231, 500, 641, 668, 672, 674, 676; 34/18, 41, 60, 115, 122; 226/95; 432/59

[56] References Cited

U.S. PATENT DOCUMENTS

| | | | |
|---|---|---|---|
| 2,016,085 | 10/1935 | Fawkes et al. | 91/68 |
| 2,020,296 | 11/1935 | Brophy | 118/642 |
| 2,321,939 | 6/1943 | Quinn | 427/296 |
| 2,864,176 | 12/1958 | Backlert et al. | 226/95 |
| 3,630,424 | 12/1971 | Rau | 226/95 |
| 3,752,639 | 8/1973 | Thagard, Jr. | 432/59 |
| 4,064,288 | 12/1977 | Shah et al. | 427/296 |
| 4,156,046 | 5/1979 | Lien et al. | 428/220 |
| 4,169,005 | 9/1979 | Fogle et al. | 156/272 |
| 4,207,998 | 6/1980 | Schmid | 226/95 |
| 4,293,606 | 10/1981 | Zollinger et al. | 428/203 |
| 4,407,867 | 10/1983 | Brück et al. | 118/672 |
| 4,427,732 | 1/1984 | Gray, III et al. | 428/172 |
| 4,447,468 | 5/1984 | Keable | 427/54.1 |
| 4,497,861 | 2/1985 | Kistner | 428/201 |
| 4,503,802 | 3/1985 | Keller et al. | 118/249 |
| 4,557,960 | 12/1985 | Vernon et al. | 428/40 |
| 4,619,949 | 10/1986 | Kistner | 522/170 |
| 4,623,676 | 11/1986 | Kistner | 522/15 |
| 4,668,601 | 5/1987 | Kistner | 403/162 |
| 4,686,114 | 8/1987 | Halliwell et al. | 427/53.1 |
| 4,786,532 | 11/1988 | Brown et al. | 427/428 |
| 4,853,255 | 8/1989 | Onishi et al. | 427/148 |
| 4,933,120 | 6/1990 | D'Amato et al. | 264/13 |
| 4,961,964 | 10/1990 | Dahlgren | 427/211 |
| 4,998,658 | 3/1991 | Distefano et al. | 226/95 |
| 5,031,338 | 7/1991 | Wedel | 34/115 |

OTHER PUBLICATIONS

Golz, W. R., "Vacuum Capstan", IBM Technical Disclosure Bulletin, vol. 10, No. 12, (May 1968), pp. 1959–1960.

Instruction Manual from Mega System Design Limited, Scarborough, Ontario, Canada (undated).

Primary Examiner—Shrive Beck
Assistant Examiner—Terry J. Owens
Attorney, Agent, or Firm—Gary L. Griswold; Walter N. Kirn; James D. Christoff

[57] ABSTRACT

An automated coating apparatus includes a coating unit for applying a curable liquid material to the entire edge-to-edge surface area of one side of a flexible sheet. The sheet is then received on a rotatable drum adjacent the curing device, and moved back and forth next to the curing device to cure the liquid material. The drum includes a plurality of apertures in communication with a regenerative blower for retaining the sheet on the drum during the curing operation without contacting the uncured liquid material on the opposite face of the sheet. The curvature of the drum functions to essentially counteract the tendency of the sheet to curl during the curing operation.

27 Claims, 9 Drawing Sheets

APPARATUS AND METHOD FOR COATING FLEXIBLE SHEETS WHILE INHIBITING CURL

BACKGROUND OF THE INVENTION

1. Field of the Invention

This invention relates to an apparatus for coating flexible, flat sheets with a thin layer of curable liquid material.

2. Description of the Related Art

Coatings are used for a variety of applications. For example, relatively thin transparent coatings are often applied to sheet stock in order to protect the underlying layer from abrasive damage. Clear protective coatings applied to photographic products protect the underlying image during repeated handling.

One particularly useful application for a protective coating is its use in the printed circuit industry on phototools (also referred to as photographic masks or stencils). Phototools have an intricate, complex image that represents an electrical circuit often containing many fine lines and junctions spaced closely together. In use, a circuit print is made by exposing a photoresist laminate to high intensity light shining through the phototool. In this manner, a single phototool sheet can be used repeatedly to make a number of prints.

It is important that the photographic image prepared on the phototool remains free of defects since defects on the phototool will be reproduced on the photoresist laminate and thus on the printed circuit. Many printed circuit manufacturers inspect the image on the phototool with a microscope or with an automatic optical scanner on a frequent basis to insure that the image lines are continuous and not defective. Depending on the size and intricacy of the image, microscopic inspections can take up to two or three hours.

Repeated handling of phototools during the manufacture of printed circuits, however, often leads to scratches on the emulsion of the phototool. Abrasions can result from many sources: particles of dirt, grit, small pieces of metal or sharp burrs (the latter are often found on the edges and corners of copper laminated sheets that serve as a backing for the printed circuit and carry the photoresist layer). Consequently, it is often desired to apply a clear protective coating to phototools to help avoid damage to the image. U.S. Pat. Nos. 4,623,676 and 4,668,601 (both assigned to the assignee of the present invention) describe radiation-curable compositions which are particularly satisfactory when used as a protective coating for phototools. Other abrasion-resistant compositions are described in U.S. Pat. Nos. 4,156,046, 4,293,606, 4,497,861, 4,619,949, all of which are assigned to the assignee of the present invention.

In the past, the coatings described in U.S. Pat. Nos. 4,623,676 and 4,668,601 have been applied to one side of flexible sheets by coating each sheet by hand or by passing the sheet through a nip between a rubber-coated drive roll and a wire wound applicator roll that is spaced a slight distance from a steel fountain roll. The coated sheet was transferred by hand (or by gravity along an inclined chute) to a flat table or conveyer belt, and a source of radiation was activated to cure the coating. However, flexible sheets tend to curl during the curing operation due to shrinkage of the coating composition that is present on only one side of the sheets.

There has been a need in the art for an automated apparatus that handles thin flexible sheets during a coating and curing operation. However, one problem in this regard is the desire to avoid any contact with the coated side of the sheet before the coating is cured so that the entire area of the sheet can be coated without defects. While a hold-down clamp or the like could be employed along the edge portions of the sheet during the curing operation, the coating, if any, on the sheet beneath the clamps would likely be distorted and/or not completely cured. Also, trimming the edge portions and cleaning the coating material from the clamps after each coating operation would be completely unsatisfactory in many applications and also an inconvenience.

SUMMARY OF THE INVENTION

The present invention relates to a coating apparatus that includes a coating unit for applying a curable liquid material to one side of a flexible sheet. The apparatus also has a curing device for curing the liquid material. A transport system moves the sheet along a path from the coating unit toward the curing device. Additionally, the transport system includes means for releasably retaining the sheet in a predetermined non-planar orientation during curing of the liquid material and without contact with the liquid material on the sheet.

During the curing operation, the sheet is held in a non-planar orientation in order to essentially counteract the tendency of the sheet to curl during curing of the liquid material. The transport system alleviates the need to manually handle the sheet during the curing operation. Avoidance of contact with one side of the sheet enables the liquid material thereon to be cured without distortion, such that the entire area of the sheet may be coated and used in a subsequent operation.

DETAILED DESCRIPTION OF THE PREFERRED EMBODIMENT

Figure 1:
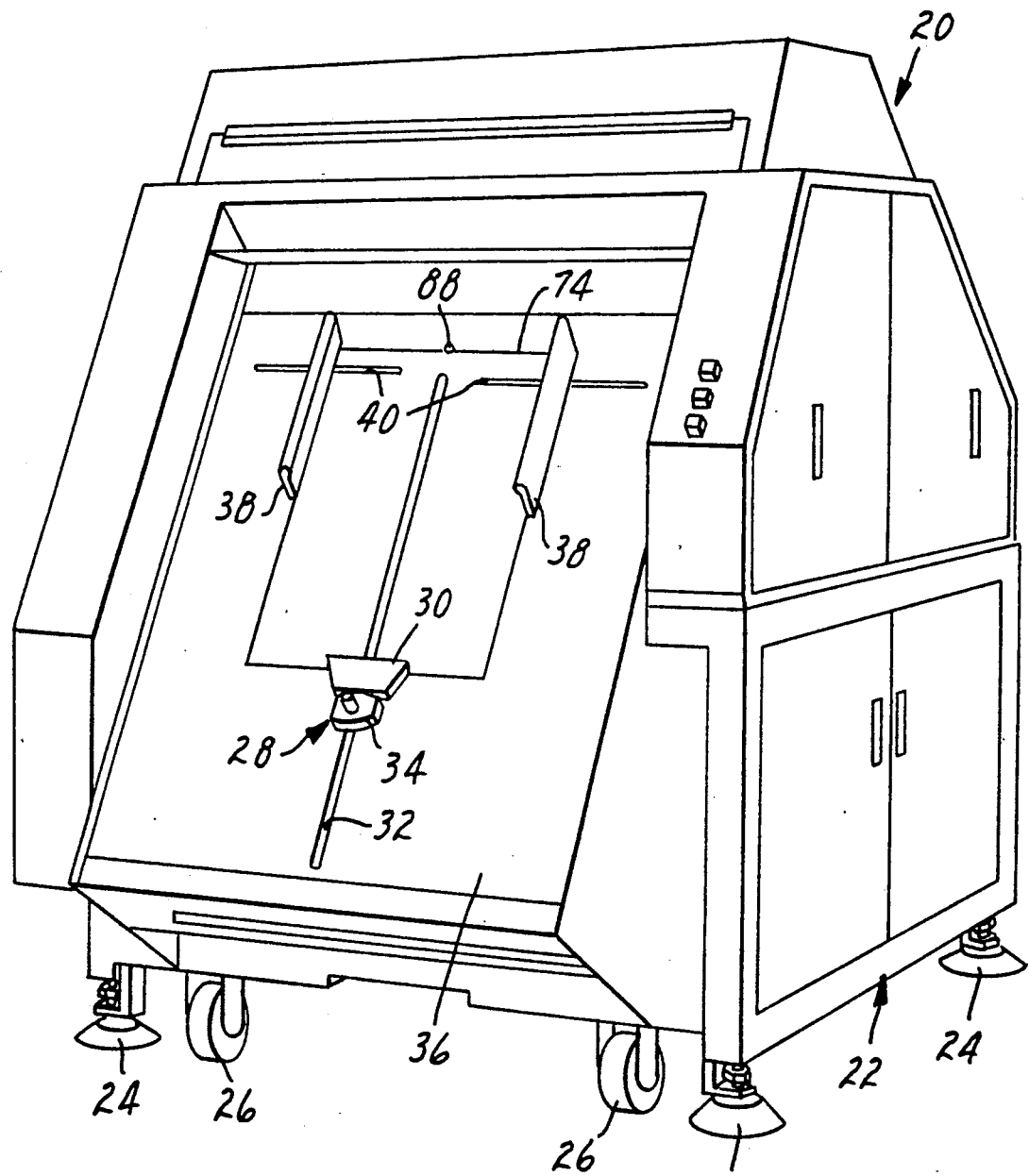
FIG. 1 is a front and right side perspective view of a coating apparatus constructed in accordance with the present invention.

Referring initially to FIG. 1, a coating apparatus 20 is shown and includes a frame 22 that rests atop four vibration dampening, vertically adjustable feet 24. Wheels 26 facilitate movement of the apparatus 20 when necessary upon upward retraction of the feet 24.

Figure 2:
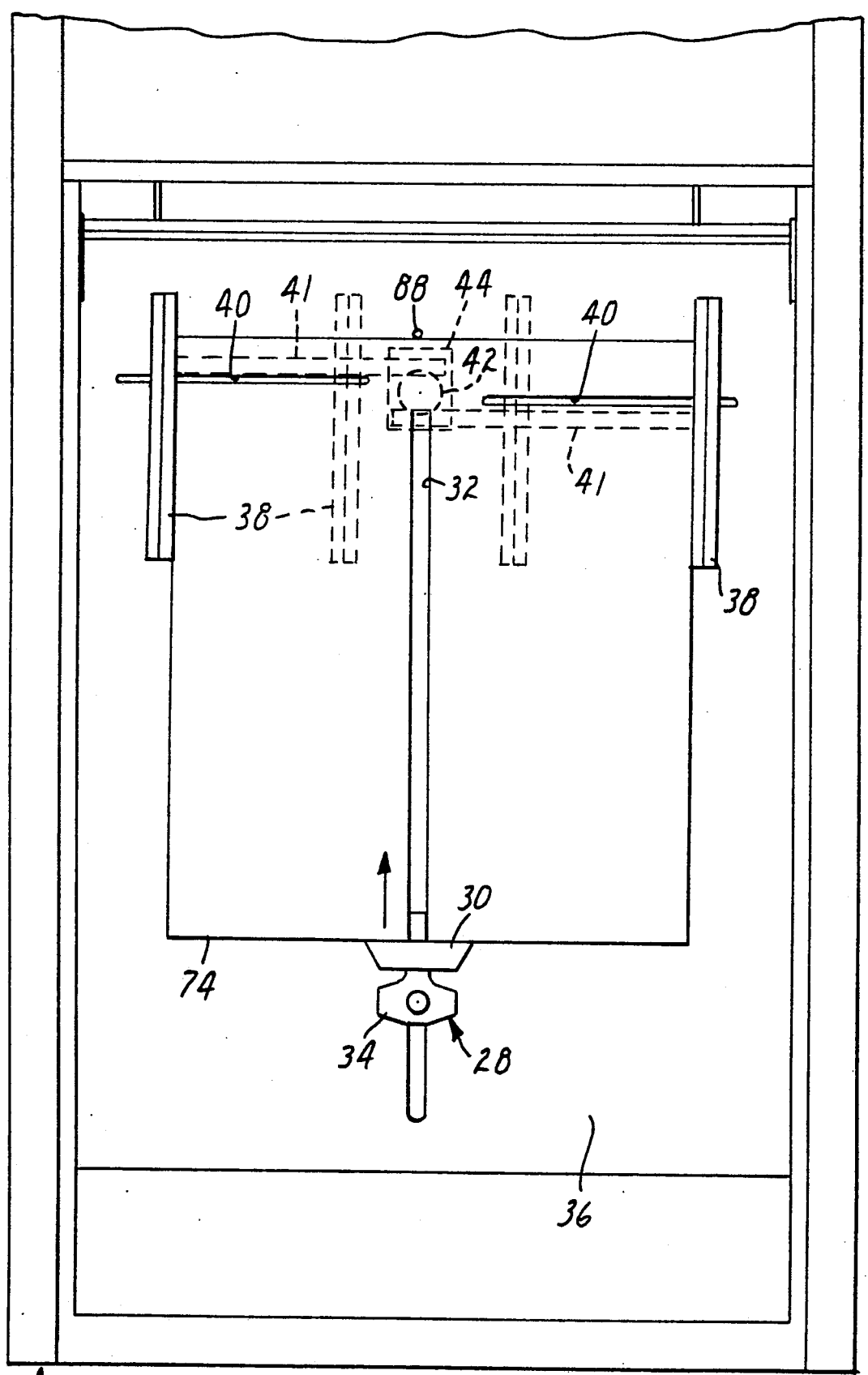
FIG. 2 is an enlarged, fragmentary view looking down at the front of the apparatus shown in FIG. 1 toward a feeder thereof.

As shown in FIGS. 1 and 2, a feeder 28 is located within a front recess of the apparatus 20, and includes a manual input handle 30 that is movable in a direction inclined 60 degrees from horizontal along a slot 32. When not in use, the handle 30 rests against a pad 34 that may be releasably secured to a front panel 36 of the apparatus 20 at any one of a number of locations along the slot 32.

The feeder 28 also includes a pair of side guides 38 that are laterally inclined at an angle adjustable in the range of 0-3 degrees relative to the longitudinal axis of the slot 32 as can be best observed in FIG. 2. The guides 38 extend across the top of the panel 36 and include mounts (not shown) that pass through horizontal slots 40 formed in the panel 36. The mounts are coupled to a rack gear 41 that engages a pinion 42 connected by an electromagnetic clutch to a rotary solenoid 44. When the motor 44 is activated, the drive system 42 simultaneously moves both of the guides 38 apart, and then reverses after a delay of time to move the guides 38 together and back toward the position shown in FIG. 2.

Figure 3:
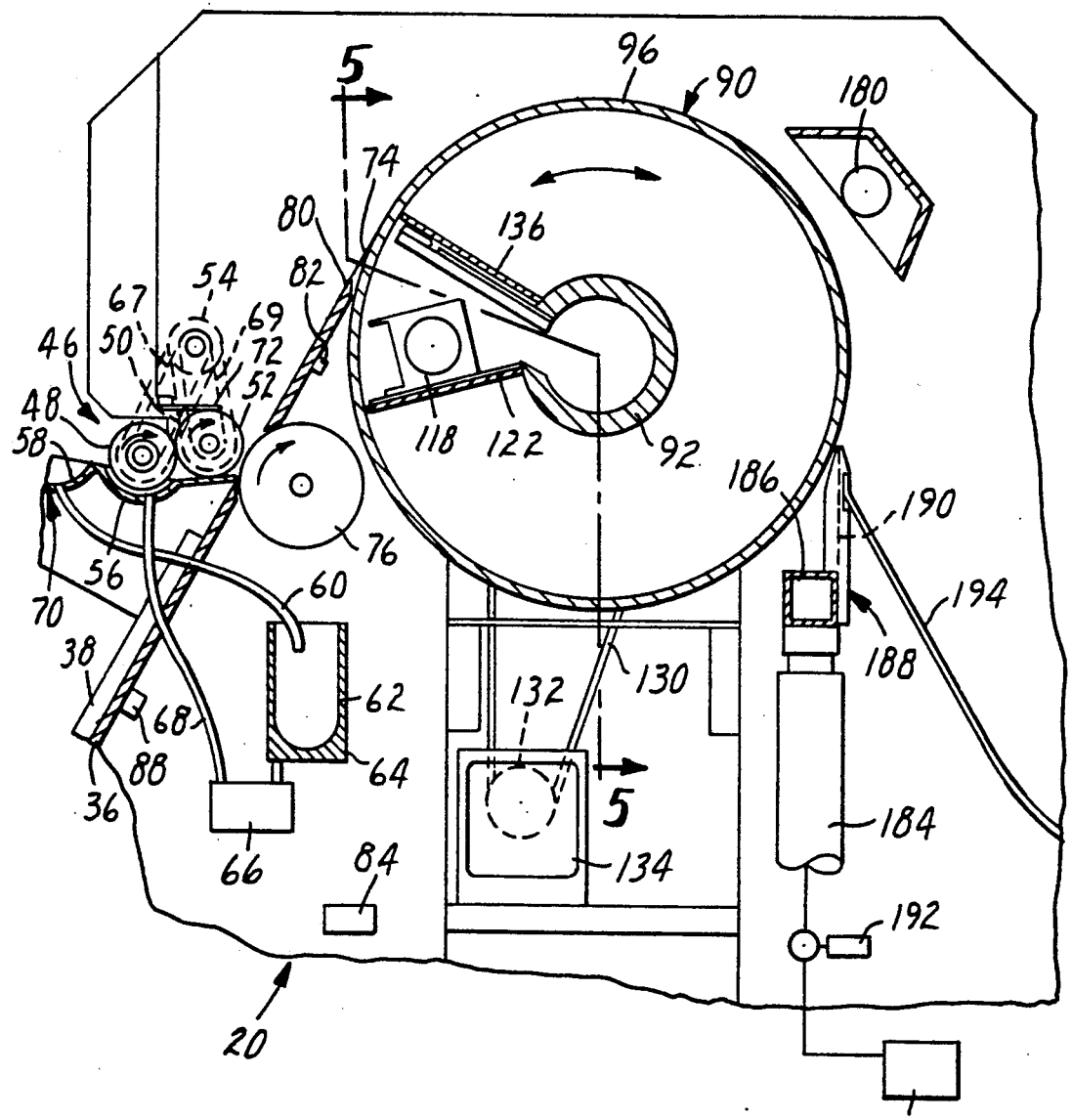
FIG. 3 is an enlarged, fragmentary, side cross sectional view in partially schematic form of the apparatus shown in FIG. 1.
Figure 4:
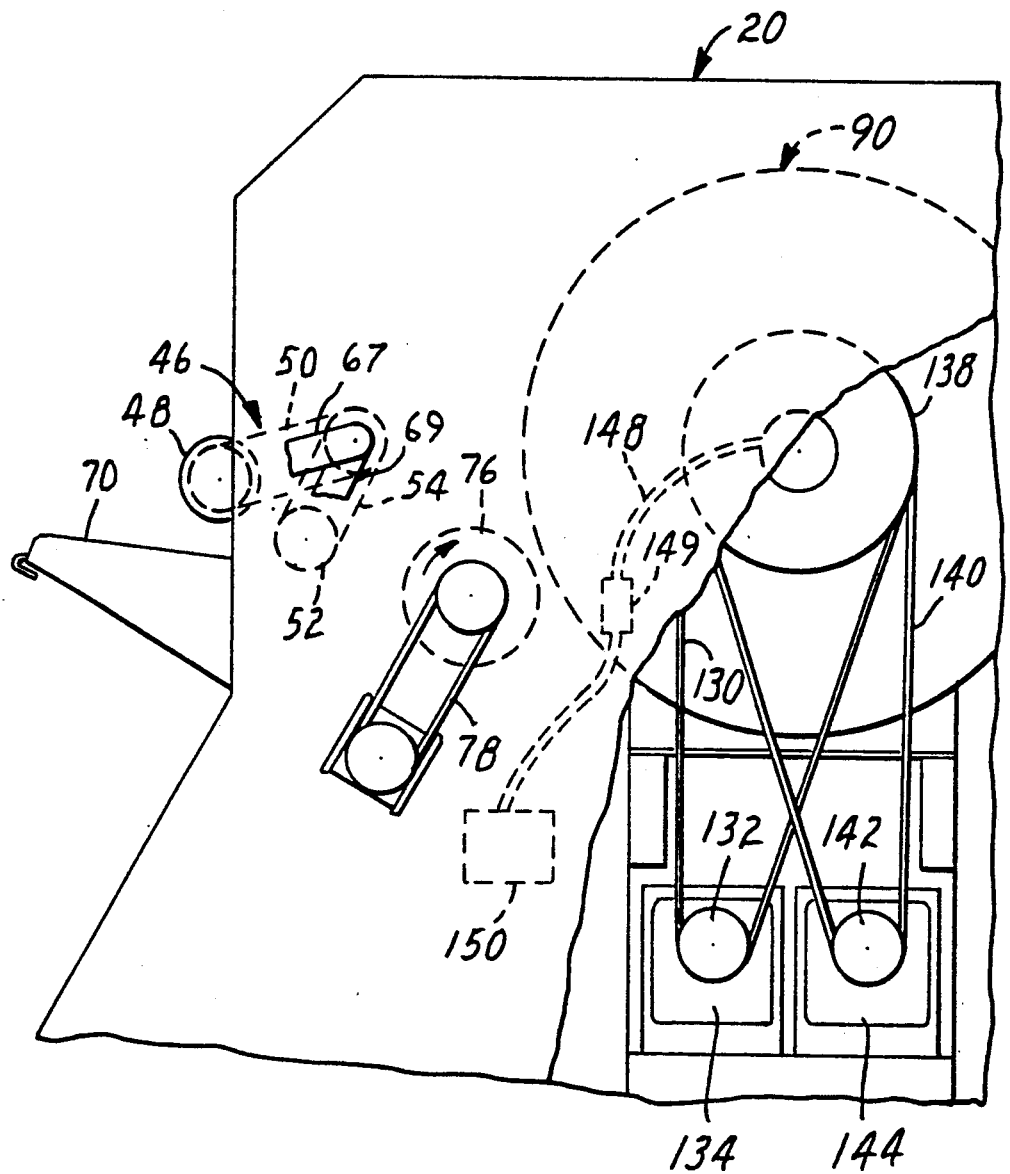
FIG. 4 is a view somewhat similar to FIG. 3 showing various drive mechanisms, wherein a coating unit of the apparatus is tilted to a non-use position.

Viewing FIGS. 3 and 4, the apparatus 20 includes a coating unit 46 for applying a curable liquid material to one side of a flexible sheet. The coating unit 46 includes a steel fountain roll 48 driven by a belt and motor system 50 in the direction of rotation shown by the arrow in FIG. 3. An applicator roll 52, also rotatable in the direction shown by the arrow in FIG. 3, is spaced a slight distance from the fountain roll 48 and is driven by a belt and motor system 54 that is shown in FIG. 4. The applicator roll is constructed by winding 0.127 mm round stainless steel wire about a 32 mm diameter roll and then hard chrome plating the wire.

A lower portion of the fountain roll 48 extends into a first trough 56 (FIG. 3) and is partially immersed in a liquid material in the trough such as the curable coating materials described in the aforementioned U.S. Pat. Nos. 4,623,676 and 4,668,601. The liquid material is introduced into one end of the first trough flows over a weir at the opposite end of the first trough 56 into a second trough 58.

Liquid material in the second trough 58 drains by means of tubing 60 to a filter bag 62 that is located within a canister 64. Liquid material passing through the filter bag 62 enters a pump 66 which directs the material through tubing 68 back into the first trough 56. In this manner, the liquid material is constantly recirculated and filtered during normal operation of the apparatus 20.

The roll 48 and the associated belt and motor system 50 are mounted on a subframe 67 that is pivotally connected to the frame 22. The roll 52 and the belt and motor system 54 are mounted on a subframe 69 that is also pivotally connected to the frame 22. Both subframes 67, 69 are movable from the positions shown in FIG. 3 and to the positions shown in FIG. 4 when access to the interior of the apparatus 20 is desired. During movement from the positions shown in FIG. 3 and to the positions shown in FIG. 4, the subframes 67, 69 initially move together, and then the subframe 67 moves an additional distance after the subframe 69 has reached its limit of pivotal movement in order to increase the separation between the rolls 48, 52.

The troughs 56, 58 are formed in a drip board 70 having a front inclined top wall that extends downwardly to the second trough 58 and a rear inclined top wall that extends downwardly to the first trough 56. When the rolls 48, 52 are in the standby position shown in FIG. 4, drips of liquid material falling from the roll 48 are caught by the front wall of the drip board 70 and thereby directed back to the second trough 58 for recirculation.

As shown in FIG. 3, a doctor blade 72 contacts the top of the applicator roll 52, and is longitudinally oscillated during rotation of the applicator roll 52. Liquid material transferred from the first trough 56 by the fountain roll 48 to the applicator roll 52 is subject to the doctor blade 72 which wipes liquid material from the surface of the applicator roll 52 (while effecting a certain amount of redistribution of the liquid material along the length of the applicator roll 52), leaving a precise thin film of liquid material on the applicator roll 52 downstream of the doctor blade 72 for coating a thin flexible sheet 74 such as a phototool made of polyester, or a photograph.

A rubber roll 76, having an outer 6 mm thick rubber layer and an overall diameter of 76 mm, is driven for rotation in the direction shown by the arrow in the FIG. 3 by a belt and motor system 78. The outer surface of the rubber roll 76 is spaced a slight distance from the applicator roll 52 when the rolls 48, 52 are in the positions shown in FIG. 3 to receive the sheet 74 as well as to avoid transferring liquid material to the rubber roll 76 from the roll 52 when the sheet 74 is not present. Preferably, the gap between the rolls 52, 76 is 0.025 mm less than the thickness of the sheet 74. For example, if the sheet thickness is 0.178 mm, the gap between the roll 52 and the roll 76 is 0.153 mm. Preferably, the rubber roll 76 is mounted on a subframe that is automatically moved further away from the applicator roll 52 if a sheet 74 is not received after an extended period of time.

As illustrated in FIG. 3, a plate 80 is located downstream of the rolls 52, 76 and has an upper surface that is coplanar with the upper surface of the panel 36. A spaced series of optic sensors 82, one of which is shown in FIG. 3, extends horizontally across the plate 80 in order to detect the arrival of the leading edge and trailing edge of the sheet 74 as well as to provide a means for estimating the width of the sheet 74 (i.e., in a horizontal direction along the length of the roll 52). The sensors 82 are electrically connected to a controller 84 (shown schematically in FIG. 3) such as a programmable minicomputer or microprocessor coupled with memory to implement commands upon receiving signals. Additionally, a solenoid operated stop gate 88 (see also FIGS. 1-2) is connected to the panel 36, and is electrically coupled to the controller 84 for reasons set out below.

Figure 5:
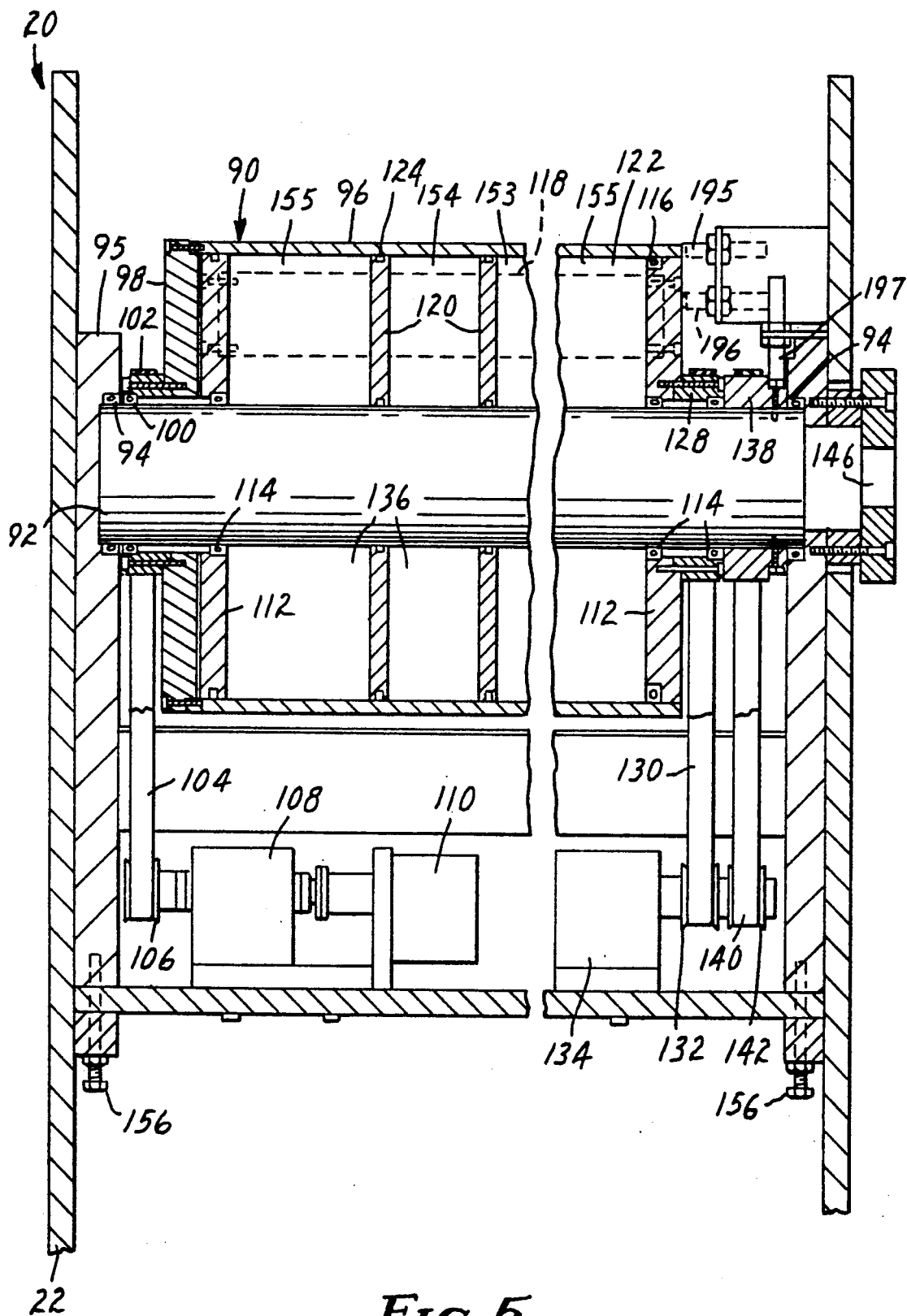
FIG. 5 is an fragmentary front view taken generally along lines 5—5 of FIG. 3 with parts broken away in section, showing a transport drum and louvers that are depicted in a somewhat different orientation than the orientation shown in FIG. 3.
Figure 6:
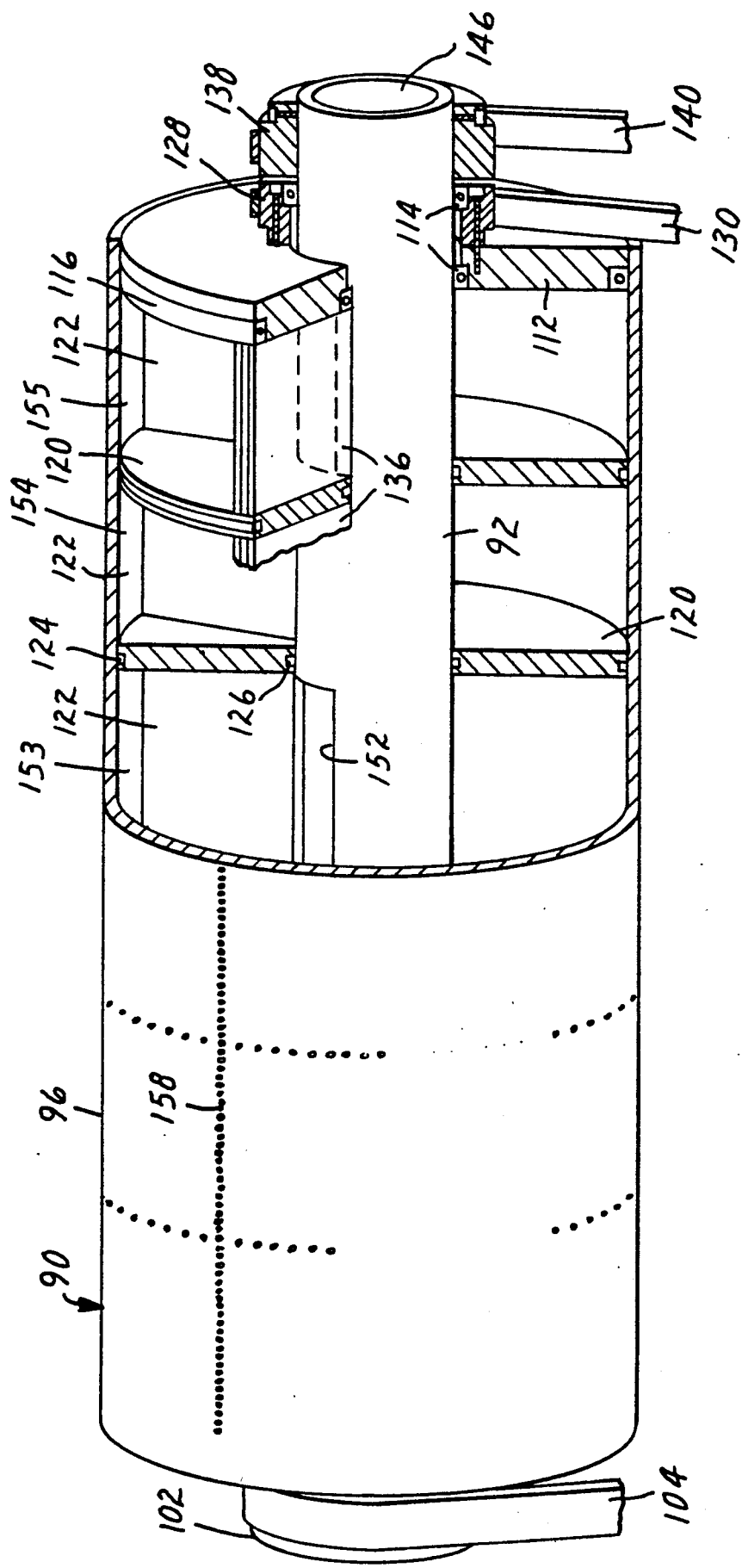
FIG. 6 is a front and right side perspective view with parts broken away in section of the drum shown in FIG. 5.

A transport system includes a vacuum drum 90 that is located downstream of the coating unit 46 and the plate 80 and that is shown in more detail in FIGS. 5 and 6. The drum 90 includes a central longitudinal tube 92 that is supported on a subframe 95 for rotation by bearings 94. The drum 90 also includes an outer cylindrical wall 96 that is rotatable relative to the tube 92. The wall 96 is carried on one end by a support assembly 98 (see FIG. 5) that is mounted on a bearing 100 carried on the tube 92. The support assembly 98 includes a toothed timing pulley 102 that is driven by a toothed timing belt 104 that is coupled, in turn, by a pulley 106. The pulley 106 is mounted on a shaft that is carried by a bearing block 108 and to a coupled DC servo motor 110.

A pair of support disks 112 are rotatably mounted on the tube 92 by sealed bearings 114. The right-hand support disk 112 (viewing FIG. 5) has a peripheral recess that receives a bearing 116 for supporting the right-hand end of the cylindrical wall 96. Each support disk 112 has a cylindrical recess for receiving respective ends of a connector bar 118 that extends parallel to the tube 92.

Four spaced-apart intermediate disks 120 (two of which are shown in FIGS. 5 and 6) are also fixedly connected to the bar 118 for simultaneous movement with movement of the outer disks 112. Additionally, five trailing louvers 122 are connected to the bar 118 and are located in the spaces between adjacent disks 112, 120. The louvers lie in a common plane that extends radially of the tube 92. The disks 112, 120 (with the exception of the right-hand disk 112 in FIG. 5) have a peripheral recess that carries an annular seal 124 in contact with the inner surface of the cylindrical wall 96. The four intermediate disks 120 have an inner recess that receives an annular seal 126 in contact with the tube 92.

The right-hand support disk 112 (viewing FIG. 5) is secured to a toothed timing pulley 128 that is driven by a toothed timing belt 130 coupled to a pulley 132 mounted on a shaft supported by a bearing block and connected to a DC servo motor 134. Activation of the servo motor 134 simultaneously moves the bar 118, the disks 112, 120 and the trailing louvers 122 in an arc about the longitudinal axis of the tube 92.

Five leading louvers 136 are fixed to the tube 92 and are also located in the spaces between adjacent disks 112, 120. The leading louvers 136 extend in a common plane that is oriented in a radial direction relative to the longitudinal axis of the tube 92. As shown in FIGS. 5 and 6, the right-hand end of the tube 92 is secured to a toothed timing pulley 138. A toothed timing belt 140 extends around the pulley 138 as well as a second toothed timing pulley 142 that is mounted on a shaft supported by a bearing block and connected to a DC servo motor 144 (see FIG. 4).

The servo motor 110 is operable to move the drum wall 96 relative to the leading louvers 136 and the trailing louvers 122 and in an arc about the longitudinal axis of the tube 92. The servo motor 134 may be activated to move the trailing louvers 122 in a rotational direction relative either to the wall 96 or to the row of leading louvers 136. The servo motor 144 may be activated to move the leading louvers 136 relative to either the wall 96 or the row of trailing louvers 122. The servo motors 110, 134, 144 are electrically connected by relays to the controller 84.

Viewing FIG. 5, the right-hand end of the tube 92 has a vacuum port 146 that is connected by tubing 148 (see FIG. 4) that is, in turn, coupled to a regenerative blower 150 (shown schematically) for providing a source of negative air pressure. A hole 152 in the center of the hollow tube 92 communicates the regenerative blower 150 with a center vacuum zone or space 153 that is bounded by the wall 96, the tube 92, the middle leading louver 136, the middle trailing louver 122 and the middle two of the four intermediate disks 120. A butterfly valve 149, electrically connected by the controller 84, is coupled to the tubing 148 and has a port in communication with the atmosphere for quickly relieving the negative air pressure in the drum 90 when actuated by the controller 84.

The orientation of the subframe 95 relative to the frame 22 may be selectively adjusted by adjustment bolts 156 (FIG. 5). In this manner, the precise position of the drum 90 may be slightly shifted as desired to ensure that the central rotational axis of the drum 90 (which coincides with the central longitudinal axis of the tube 92) is parallel to the rotational axis of the applicator roll 52 and the rubber roll 76.

Figure 7:
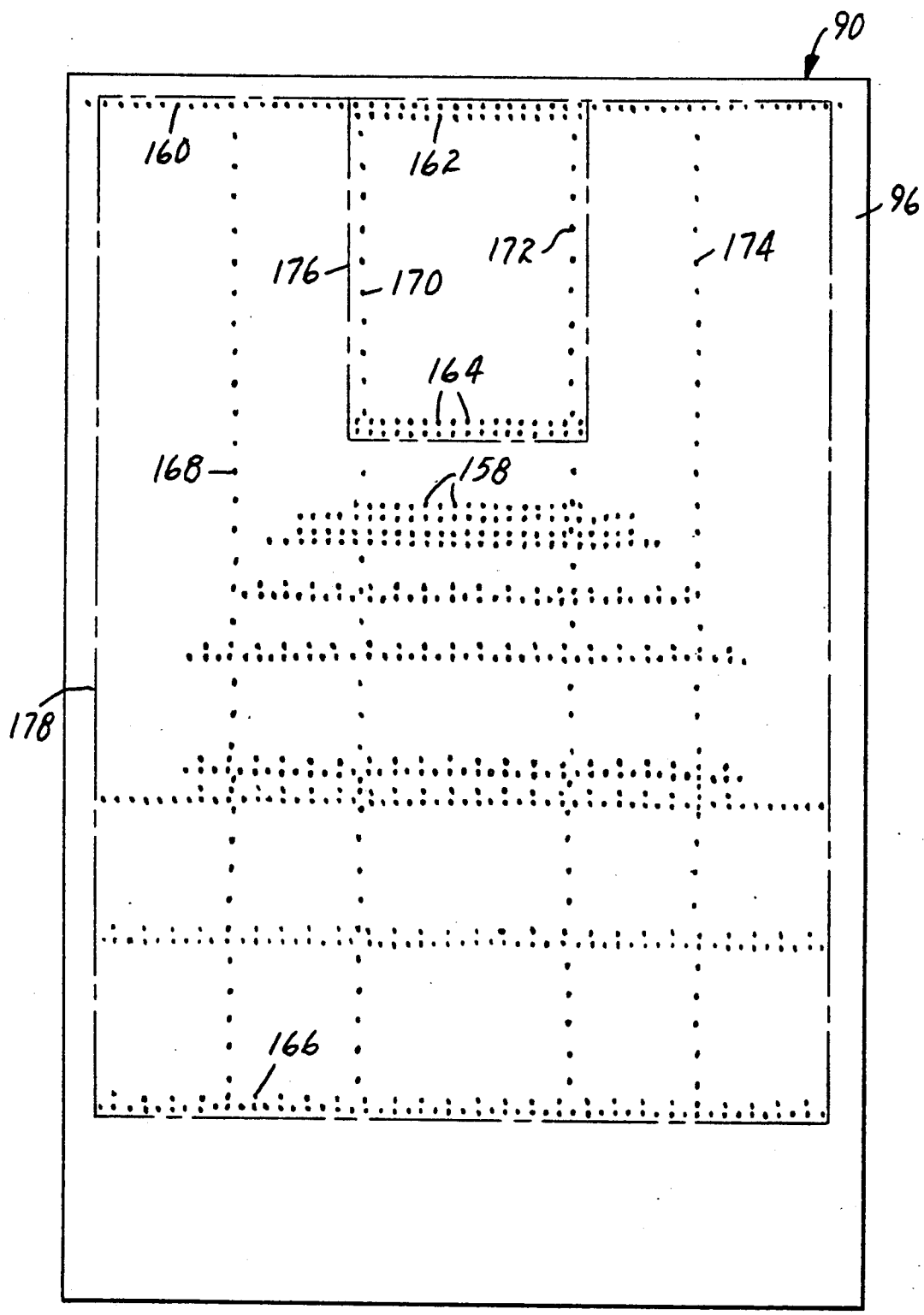
FIG. 7 is a view of an outer wall of the drum shown in FIGS. 5–6 as would be observed when hypothetically straightened to a flat orientation.

FIG. 7 is a flat pattern view of the drum wall 96 to show the plurality of the apertures 158 that lead either to the central space 153, to one of two intermediate vacuum zones or spaces 154 (see FIG. 5) flanking the space 153, or to one of two end-most vacuum zones or spaces 155 that lie outwardly of the spaces 154. Some of the apertures 158 are laid out in rows such as rows 160, 162, 164 and 166 that extend parallel to the rotational axis of the drum 90. Other apertures 158 are laid out in rows such as rows 168, 170, 172 and 174 that extend circumferentially around the wall 96.

The numerous rows of apertures 158 provide patterns that correspond to various sizes of the sheets (such as sheet 74) that are expected to be received on the drum 90. For example, a relatively small sheet such as sheet 176 in FIG. 7 has a periphery that overlies the rows 162, 164, 170 and 172. In comparison, a larger sheet such as sheet 178 overlies all of the apertures 158 including the rows 160, 166, 168 and 174 and all of the apertures 158 therebetween.

As shown in FIG. 3, a curing lamp device 180 provides a source of ultraviolet radiation to cure liquid material on the sheet 74 once the sheet 74 is received on the drum 90. Depending on the composition of the liquid material, the lamp device 180 alternatively may be a source of incandescent or fluorescent energy, electron beam radiation, ultrasonic energy, infrared radiation, microwave energy or x-ray excitation. The lamp device 180 preferably is a xenon quartz bulb that is air cooled by a blower and has an "on" pulse width of 100 to 300 microseconds at a frequency ranging from 1 to 50 pulses per second, so that the lifetime of the lamp is extended and the lamp operates at a relatively cool temperature to avoid undue thermal expansion of the sheet 74. Good results have been observed using a pulse width of 150 microseconds and a frequency of 7 pulses per second. The lamp device 180 is located at approximately a two o'clock position relative to the central axis of the drum 90, and is electrically coupled to the controller 84.

A source of pressurized air 182, shown schematically in FIG. 3, is connected to a supply tube 184 in communication with a manifold 186. An air knife 188 extends along the width of the wall 96 parallel to the longitudinal axis of the drum 90, and has a narrow internal slot 190 coupled to the manifold 186. A solenoid valve 192 is connected to the controller 84 and, when actuated by the controller 84, communicates the source of pressurized air 182 with the slot 190 to cause a short burst of air to lift the leading edge of the sheet 74 from the drum wall 96 when desired.

The air knife 188 is located at approximately a three o'clock position relative to the rotational axis of the drum 90, and is adjacent to an upper edge of an inclined chute 194. The chute 194 leads to a holding rack (not shown) that retains the coated sheets 74 until collected by the operator.

OPERATION

In use, the sheet 74 is placed on the feeder 28 in a position lying on the panel 36 between the guides 38. If necessary, the guides 38 are adjusted by hand to the proper width to lightly come into contact with edges of the sheet 74. If another sheet is on the drum 90 at that time, the stop gate 88 will have been activated by the controller 84 for movement to an extended position to block passage of the sheet 74 toward to the coating unit 46.

The stop gate 88 is retracted by the controller 84 when the drum 90 is free of the presence of a sheet. The operator then slides the handle 30 toward the coating unit 46 in the direction of the arrow shown in FIG. 2. The rolls 48, 52, 76 run continuously and the leading edge of the sheet 74 is grabbed by the rubber roll 76 as soon as the leading edge of the sheet 74 is near the space between the rolls 52, 76.

The gap between the fountain roll 48 and the applicator roll 52 is adjustable from 0.125 to 0.25 mm. Depending upon the viscosity of the liquid material, the liquid material initially bridges the gap between the rolls 48, 52 either without assistance, or by manually applying a quantity of the liquid material along the length of the gap. Also, the rotational speed of the fountain roll 48 may be increased during an initial period to assist in "throwing" part of the liquid material toward the applicator roll 52 so that the gap between the rolls 48, 52 is bridged.

The rubber roll 76 provides a frictional surface that drives the sheet 74 toward the plate 80. The applicator roll 52, turning in the same rotational direction as the rubber roll 76, slips against the upper surface of the sheet 74. The slippage is facilitated by the lubricity of the liquid material. The applicator roll 52 deposits a relatively thin (approximately 2 to 100 micron thick) uniform coating across the entire upper face of the sheet 74. The thickness of the coating on the sheet 74 may be varied by adjusting the speed of the applicator roll 52 or the rubber roll 76, and also is determined by the viscosity of the liquid material. The thickness of the coating may also be changed by varying the size of the wire that is wound around the applicator roll 52.

As soon as the leading edge of the sheet 74 passes over the sensors 82, the rotary solenoid 44 is activated by the controller 84 to spread the guides 38 apart and allow the trailing edge of the sheet 74 to move toward the coating unit 46 unimpeded by the guides 38. Such separation of the guides 38 is desired because, as mentioned earlier, the guides 38 may be canted at a small angle in the plane of the panel 36 relative to a reference line that also lies in the same plane and is tangent to the roll 76 and perpendicular to the direction of extension of the roll 76. It has been found that feeding the sheet 74 by the guides 38 in such a slightly canted direction facilitates the coating operation by reducing the likelihood of undue vibration of the coating unit 46 and enables a relatively smooth, thin, uniform coating to be applied to the sheet 74. (If the length of a wide sheet 74 is relatively long, the angle of cant should be decreased to ensure that the entire width of the sheet 74 along its length is coated with liquid material.)

Figure 8:
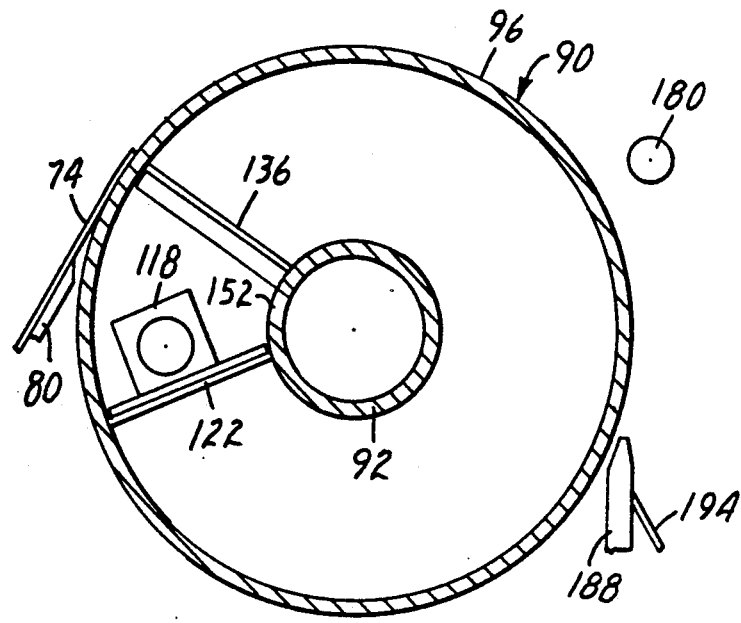
FIGS. 8, 9, 10, 11, 12 and 13 are side cross-sectional views of the drum shown in FIG. 5 in various stages during a curing operation.

The rubber roll 76 advances the sheet 74 from the coating unit 46 along the plate 80 and toward the drum 90, and the leading edge of the sheet 74 initially contacts the drum wall 96 in the manner shown in FIG. 8. The drum wall 96, trailing louvers 122 and leading louvers 136 have previously been moved to respective home positions shown in FIGS. 3 and 8 by the programmed controller 84 that selectively energizes the servo motors 110, 134 and 144 for proper movements.

After a short time delay from the time that the sensors 82 detect the leading edge of the sheet 74, the servo motors 110, 144 are activated by the controller 84 to rotate the drum wall 96 and leading louvers 136; simultaneously, the controller 84 actuates the regenerative blower 150 and closes the butterfly valve 149 to provide a negative air pressure in the spaces 153, 154, 155. The drum wall 96 and leading louvers 136 rotate at a speed matching the speed of the advancing sheet 74 so that the sheet 74 is synchronously received on the wall 96 in face-to-face contact without slippage. The trailing louvers 122 remain stationary at this time, thus causing the spaces 153, 154, 155 to expand and allow additional apertures 158 to be exposed to the vacuum spaces 153, 154, 155 and draw air toward the regenerative blower 150 in order to facilitate full facial contact of the leading portion of the sheet 74 with the drum wall 96 as additional portions of the sheet 74 are received on the drum 90.

Figure 9:
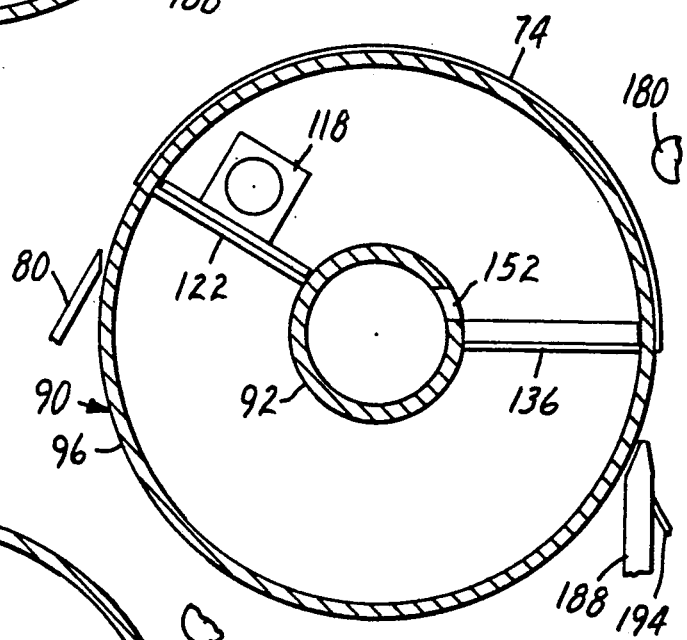

Once the entire sheet 74 is received on the drum 90 as shown in FIG. 9, the spaces 153, 154, 155 have expanded to such a degree that both the leading edge and trailing edge of the sheet 74 on the drum 90 overlie apertures 158 in communication with the spaces 153, 154, 155, facilitating retention of the sheet 74 on the drum 90 during further movement of the latter. Next (and as determined from a short time delay from the time that the trailing edge of the sheet 74 passed over the sensors 82) the controller 84 activates servo motor 134 to cause the trailing louvers 122 to rotate together with the drum wall 96 and the leading louvers 136.

The controller 84 also activates the lamp device 180 after a short delay from the time that the sensors 82 detect the leading edge of the sheet 74, which approximately corresponds to the time required for the leading edge of the sheet 74 to be located adjacent the lamp device 180. While the lamp device 180 pulses, the drum 90 continues to move forward in an arc to the position shown in FIG. 10, and then back to the position shown in FIG. 11 by reversing the flow of current to the servo motors 110, 134 and 144.

Figure 10:
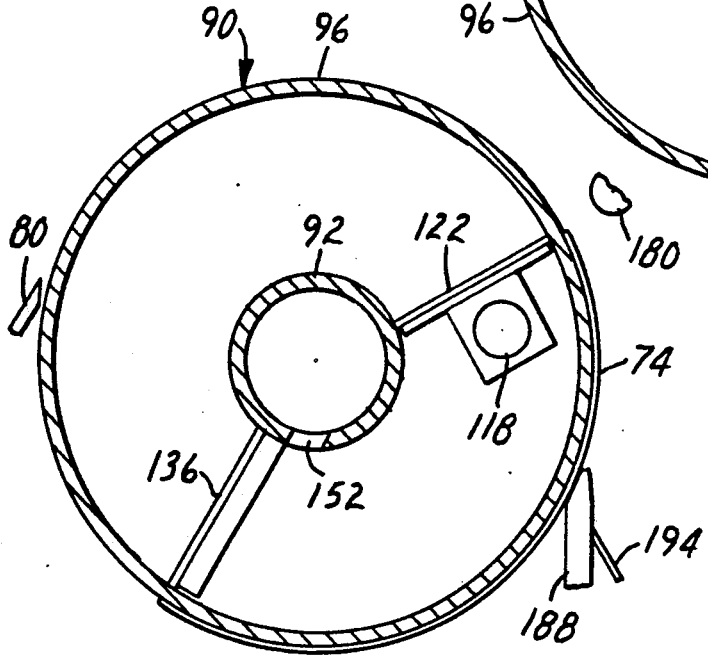
Figure 11:
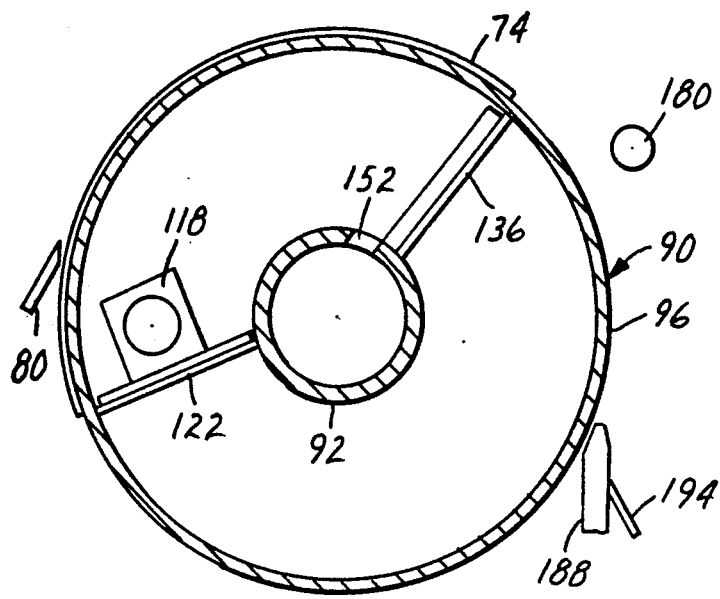

Next, the controller 84 continues to turn the drum 90 back and forth through partial revolutions between the position shown in FIG. 10 and the position shown in FIG. 11 until a sufficient time has elapsed for the lamp device 180 to completely cure the coating on the exposed outer face of the sheet 74. During such back and forth rotational movement, the drum wall 96 moves together with the trailing louvers 122 and the leading louvers 136, so that the number of apertures 158 in communication with the spaces 153, 154, 155 remains constant and the sheet 74 continues to lie in firm face-to-face contact with the drum wall 96. If desired, the speed of all three servo motors 110, 134 and 144 may be decreased or increased during the curing operation once the sheet 74 has moved past the gap between the rolls 52, 76 in order to facilitate the curing reaction in accordance with the composition of the liquid material and the type of curing energy utilized. Next, the drum 90 moves to the orientation shown in FIG. 12 and brings the leading edge of the sheet 74 directly above the air knife 188.

The regenerative blower 150 is then deactivated and butterfly valve 149 is opened by the controller 84 to the atmosphere, causing the negative air pressure in the spaces 153, 154, 155 to approach zero. Simultaneously, the controller 84 briefly opens the solenoid valve 192, enabling the air knife 188 to emit a short blast of pressurized air toward the leading edge of the sheet 74. As the negative air pressure in the spaces 153, 154, 155 subsides, the short blast of air from the air knife 188 lifts the leading edge of the sheet 74 from the drum wall 96 as shown in FIG. 12.

Figure 12:
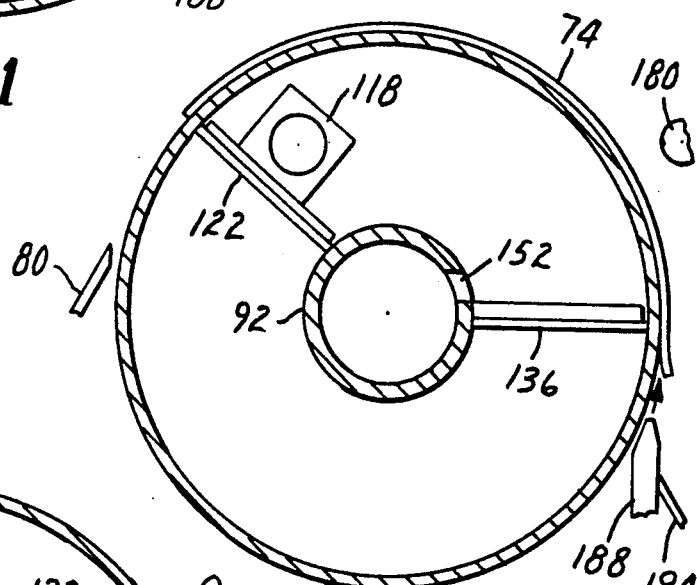
Figure 13:
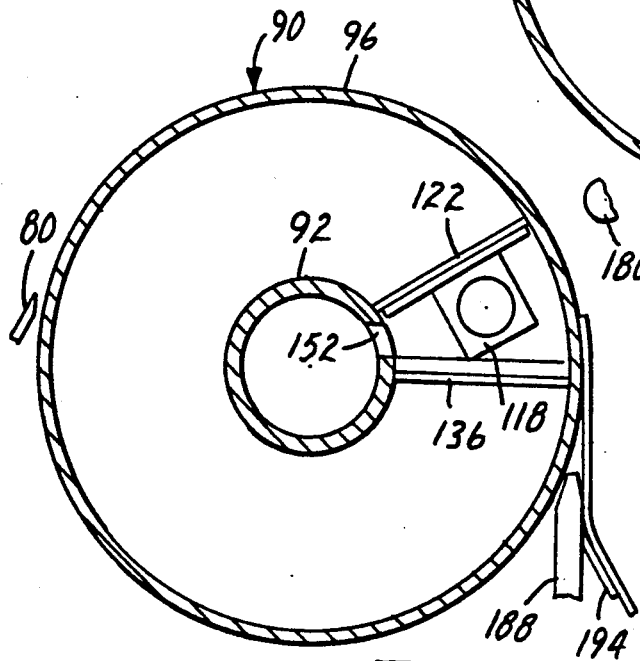

Immediately thereafter, the regenerative blower 150 is reactivated and the servo motors 110, 134 are actuated by the controller 84 to resume movement of the drum wall 96 and simultaneous movement of the trailing louvers 122; however, the servo motor 144 is not actuated at this time and the leading louvers 136 remain stationary in the three o'clock position shown in FIG. 12. In addition, the butterfly valve 149 is closed to increase the amount of negative air pressure in the spaces 153, 154, 155 to ensure that trailing portions of the sheet 74 behind the leading louvers 136 remain in firm contact with the drum wall 96. The trailing louvers 122 and drum wall 96 move toward the position shown in FIG. 13, thereby enabling the leading edge of the sheet 74 to engage the chute 194. Ultimately, the trailing louvers 122 approach a position adjacent to the leading louvers 136, and remaining portions of the sheet 74 on the wall 96 fall from the latter and the sheet 74 then slides down the chute 194 toward the holding rack.

The controller 84 controls the rotational positions of the louvers 122, 136 and drum wall 96 by energizing servo motors 110, 134, 144 only during controlled, precise intervals of time. However, a homing apparatus is also provided to avoid errors in positions of the louvers 122, 136 and the drum wall 96 that might otherwise accumulate during operation of the apparatus 20. The homing apparatus includes three induction-type proximity detectors 195, 196, 197 (FIG. 5) connected to the controller 84: detector 195 monitors the position of the drum wall 96, detector 196 monitors the position of the trailing louvers 122 and detector 197 monitors the position of the leading louvers 136. After each curing operation is completed and the sheet 74 is discharged to the chute 194, the controller 84 undertakes a homing sequence to maintain satisfactory control of the respective positions of the wall 96, the trailing louvers 122 and the leading louvers 136. In this manner, the drum 90 may be returned to the positions shown in FIGS. 3 and 8 to await the next sheet with assurance that the leading edge of such sheet will be located at the proper intended position on the drum wall 96.

The "seals" 124, 126 do not provide a completely air-tight seal, and instead allow a certain amount of air leakage from the center space 153 to the intermediate spaces 154 and the end spaces 155 depending upon the amount of negative pressure in the spaces 153, 154. Before the sheet 74 is received on the drum 90, all of the apertures 158 are open to the atmosphere and substantially all of the air pumped by the regenerative blower 150 through the hole 152 is drawn in through the apertures 158 located over the center space 153, as the seals 124, 126 adjacent the center space 153 provide some resistance to the leakage of air therepast.

As the sheet 74 is received on the drum 90, the apertures 158 overlying the center space 153 are covered (assuming that the sheet 74 is at least as wide as the sheet 176 shown in FIG. 7). As a consequence, the amount of negative air pressure in the center space 153 increases and additional air leakage begins to flow past the adjacent seals 124, 126, causing an increase in the amount of negative air pressure in the intermediate spaces 154. Similarly, if the sheet 74 is sufficiently wide to cover substantially all of the aperatures 158 over the spaces 53, 154, the leakage of air past seals 124, 126 on the disks 120 partitioning the spaces 154 from the spaces 155 will increase and increase the amount of negative air pressure in the end spaces 155.

As such, the amount of negative air pressure in the spaces 153, 154, 155 self-adjusts to compensate for the width of the sheet 74 and to ensure that the sheet 74 is firmly grasped against the drum wall 96 during the curing operation. In practice, the seals 124 that allow the controlled leakage are made to order from Furon Corporation, have a square cross-section and are made from carbon/polytetrafluoroethylene. The seals 126 are from Minnesota Rubber, A Quadion Company (catalog no. 346). A nominal 0.08 mm tolerance between the seals 124, 126 and adjacent relatively moving adjacent surfaces provides air leakage. (Additional leakage, if needed, can be attained by drilling small holes or grooves past the seals 124, 126). The apertures 158 have a diameter of 2 mm, and the regenerative blower 150 provides a differential pressure of 122 cm water when all of the apertures 158 are covered. The regenerative blower 150 is model No. R4310A-2 made by GAST.

As can be appreciated, the rubber roll 76 in combination with the plate 80 constitute a part of the transport system in addition to the drum 90 for moving a series of discrete flexible sheets along a path from the coating unit 46 toward the curing device 180. Also, the drum wall 96 is a movable support for moving the phototool sheet 74 adjacent the curing device 180, and provides a means for retaining the sheet 74 in a predetermined curved, non-planar orientation in the shape of a cylinder without contacting the liquid material coated on one side of the sheet 74. As can be understood by reference to, e.g., FIGS. 9–13, the side of the sheet 74 that is coated is held in a convex orientation while the coating is cured. As the liquid material cures and contracts, the tendency of the sheet 74 to curl is substantially, if not essentially completely, compensated by the curvature of the drum wall 96 (which is curved in a direction opposite of the orientation that the sheet 74 would otherwise tend to assume). Moreover, since the entire outward face of the sheet 74 is coated, there is no need to subject the sheet 74 to a cutting or trimming operation as might otherwise occur with the use of hold-down clamps or the like.

Preferably, the controller 184 calculates the approximate area of the sheet 74 by determining its length and width. The length is determined by counting pulses received from a rotary shaft encoder that is coupled to the servo motor 110. This count is accumulated between the time that the sensor 82 detects the leading edge of the sheet 74 and the trailing edge of the sheet 74. The width of the sheet 74 is approximated by determining which of the sensors 82 have detected the presence of the overlying sheet 74. The calculated area of the sheet 74 is then used for keeping a record of the total area coated over a period of time.

We claim:

1. Coating apparatus comprising:
    a coating unit for applying a curable liquid material to one side of a discrete flexible sheet;
    a curing device for curing the liquid material on the sheet; and
    a transport system for moving the sheet along a path from the coating unit toward the curing device, said transport system including means for releasably retaining the sheet in a predetermined non-planer orientation with said one side of said sheet being in a convex orientation during curing of the liquid material without contacting the liquid material on the sheet.

2. The apparatus of claim 1 wherein said means for retaining the sheet in a predetermined non-planer orientation comprises a drum.

3. The apparatus of claim 2 wherein said drum is substantially cylindrical.

4. The apparatus of claim 3 wherein said drum has a central axis and is rotatable about said central axis.

5. The apparatus of claim 2 wherein said drum has an outer wall having a plurality of apertures.

6. The apparatus of claim 5 wherein said means for retaining the sheet in a predetermined non-planer orientation includes a regenerative blower connected to said apertures.

7. The apparatus of claim 6 wherein said drum has at least one internal vacuum space communicating with said apertures.

8. The apparatus of claim 7 wherein said drum includes at least one internal louver that is movable relative to said wall of said drum.

9. The apparatus of claim 8 including means for moving said at least one louver in correspondence to the amount of the sheet in contact with the drum.

10. The apparatus of claim 9 wherein said means for moving said at least one louver includes a controller and a sensor coupled to the controller.

11. Coating apparatus comprising:
a coating unit for applying a curable liquid material to one side of a discrete flexible sheet;
a curing device for curing said liquid material;
a curved wall for supporting said sheet adjacent said curing device with said one side of said sheet being in a convex orientation; and
a source of negative pressure connected to said wall for retaining said sheet on said wall as said material is cured.

12. The apparatus of claim 11 wherein said apparatus includes a drum and said wall is an outer wall of said drum.

13. The apparatus of claim 12 wherein said drum has a central axis and is movable in opposite rotational directions about said axis to move said sheet adjacent said curing device.

14. The apparatus of claim 11 wherein said apparatus includes at least one space next to the wall connected to said source of negative pressure, and wherein said wall is provided with a plurality of apertures communicating with said at least one space.

15. The apparatus of claim 14 wherein said space has a volume that is variable in size in accordance with the size of the sheet.

16. The apparatus of claim 15 wherein said apparatus includes a drum, wherein said wall is an outer wall of said drum, wherein said at least one space is in said drum, and wherein said at least one space is at least partially defined by louvers that are movable to change the size of said space.

17. The apparatus of claim 16 including a controller for controlling the movement of said louvers.

18. The apparatus of claim 11, wherein said wall is movable.

19. The apparatus of claim 18 including a controller for controlling the movement of said wall.

20. The apparatus of claim 19 wherein said transport system includes a plate and a rubber roll for advancing said sheet along said plate and toward said wall.

21. The apparatus of claim 11, wherein said curing device includes a source of ultraviolet radiation.

22. The apparatus of claim 11, wherein said curing device includes a source of incandescent or fluorescent light energy, electron beam radiation, ultrasonic energy, infrared radiation, microwave energy, or x-ray excitation.

23. The apparatus of claim 11, wherein said coating unit includes a roll for applying said curable liquid material to the entire surface area of one side of said discrete flexible sheet.

24. A method of coating a discrete flexible sheet comprising the steps of:
applying a curable liquid material to one side of the sheet;
moving the sheet along a path toward a curing device; and
releasably retaining the sheet in a curved orientation with said one side being held in a convex orientation as aid sheet is moved past said curing device without contacting liquid material on said one side of said sheet.

25. The method of claim 24, wherein said step of releasably retaining the sheet in a curved orientation includes the step of supporting the sheet on a curved wall.

26. The method of claim 25, wherein said step of releasably retaining the sheet in a curved orientation includes the step of drawing air through apertures in the wall to releasably retain the sheet on the wall.

27. The method of claim 24, wherein said step of releasably retaining the sheet in a curved orientation includes the step of supporting the sheet on a drum and moving the drum about its central axis along arcs in opposite directions next to a curing device.

* * * * *

UNITED STATES PATENT AND TRADEMARK OFFICE
CERTIFICATE OF CORRECTION

PATENT NO. : 5,137,758

DATED : August 11, 1992

INVENTOR(S) : John F. Kistner, Thomas M. Milbourn and Robert G. Pleban

It is certified that error appears in the above-identified patent and that said Letters Patent is hereby corrected as shown below:

Col. 3, line 41, insert after "trough" -- 56, and --.

Col. 9, line 66, "53" should be -- 153 --.

Col. 12, line 38, "aid" should be -- said --.

Signed and Sealed this

Twenty-eighth Day of September, 1993

*Attest:*

BRUCE LEHMAN

*Attesting Officer*   *Commissioner of Patents and Trademarks*